US012776374B2

(12) United States Patent
Lien et al.

(10) Patent No.: US 12,776,374 B2
(45) Date of Patent: Oct. 27, 2026

(54) SELECTION OF AN OPTIMAL SINGLE LEVEL CELL PROGRAMMING SCHEME

(71) Applicant: Micron Technology, Inc., Boise, ID (US)

(72) Inventors: Yu-Chung Lien, San Jose, CA (US); Dheeraj Srinivasan, San Jose, CA (US); Michael G. Miller, Boise, ID (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 102 days.

(21) Appl. No.: 18/767,584

(22) Filed: Jul. 9, 2024

(65) Prior Publication Data

US 2025/0022515 A1 Jan. 16, 2025

Related U.S. Application Data

(60) Provisional application No. 63/512,794, filed on Jul. 10, 2023.

(51) Int. Cl.

| | |
|---|---|
| ***G11C 16/10*** | (2006.01) |
| ***G11C 11/16*** | (2006.01) |
| ***G11C 11/22*** | (2006.01) |
| ***G11C 11/56*** | (2006.01) |
| ***G11C 16/34*** | (2006.01) |
| *G11C 11/4063* | (2006.01) |
| *G11C 13/00* | (2006.01) |
| *G11C 16/06* | (2006.01) |

(52) U.S. Cl.

CPC ........ *G11C 16/102* (2013.01); *G11C 11/1675* (2013.01); *G11C 11/2275* (2013.01); *G11C 11/5628* (2013.01); *G11C 16/10* (2013.01); *G11C 16/3459* (2013.01); *G11C 11/4063* (2013.01); *G11C 13/0069* (2013.01); *G11C 16/06* (2013.01)

(58) Field of Classification Search

CPC .............. G11C 16/102; G11C 11/1675; G11C 11/2275; G11C 11/5628; G11C 16/10; G11C 16/3459; G11C 11/4063; G11C 13/0069; G11C 16/06; G11C 16/0483

See application file for complete search history.

(56) References Cited

U.S. PATENT DOCUMENTS

| | | | | |
|---|---|---|---|---|
| 10,762,967 | B2 * | 9/2020 | Shappir ............... | G06F 11/1048 |
| 10,971,240 | B1 * | 4/2021 | Dunga ................. | G11C 16/344 |
| 2010/0220509 | A1 * | 9/2010 | Sokolov ............... | G11C 27/005 365/45 |
| 2025/0014657 | A1 * | 1/2025 | Lien .................... | G11C 11/5628 |

* cited by examiner

*Primary Examiner* — Amir Zarabian
*Assistant Examiner* — Justin Bryce Heisterkamp
(74) *Attorney, Agent, or Firm* — Harrity & Harrity, LLP

(57) ABSTRACT

In some implementations, a memory device may receive, from a host device, a program command. The memory device may determine that the program command is associated with a single level cell (SLC) program command. The memory device may determine a size of host data associated with the program command. The memory device may select a programming scheme, from multiple candidate programming schemes, to be used to write the host data to a memory based on the size of the host data and based on determining that the program command is associated with the SLC program command. The memory device may write the host data to the memory using the programming scheme.

20 Claims, 7 Drawing Sheets

SELECTION OF AN OPTIMAL SINGLE LEVEL CELL PROGRAMMING SCHEME

CROSS REFERENCE TO RELATED APPLICATION

This Patent Applications claims priority to U.S. Provisional Patent Application No. 63/512,794, filed on Jul. 10, 2023, and entitled "SELECTION OF AN OPTIMAL SINGLE LEVEL CELL PROGRAMMING SCHEME." The disclosure of the prior Application is considered part of and is incorporated by reference into this Patent Application.

TECHNICAL FIELD

The present disclosure generally relates to memory devices, memory device operations, and, for example, to selection of an optimal single level cell programming scheme.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). In some examples, a non-volatile memory cell, such as a NAND cell, may be categorized as a single-level cell (SLC), a multi-level cell (MLC), a triple-level cell (TLC), or a quad-level cell (QLC), among other examples. An SLC stores a single binary bit per memory cell, and thus may store either a binary 1 or a binary 0. An MLC, a TLC, and a QLC may store multiple bits per memory cell. More particularly, an MLC may store two binary bits per memory cell, a TLC may store three binary bits per memory cell, and a QLC may store four binary bits per memory cell. In some other examples, any cell capable of storing more than one binary bit per cell may be generally referred to as an MLC. To store information, an electronic device may write to, or program, a set of memory cells to a threshold voltage corresponding a binary value (e.g., one of 0 or 1 for an SLC: one of 00, 01, 10, or 11 for an MLC; and so forth). To access the stored information, the electronic device may read, or sense, the stored voltage from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Figure 1:
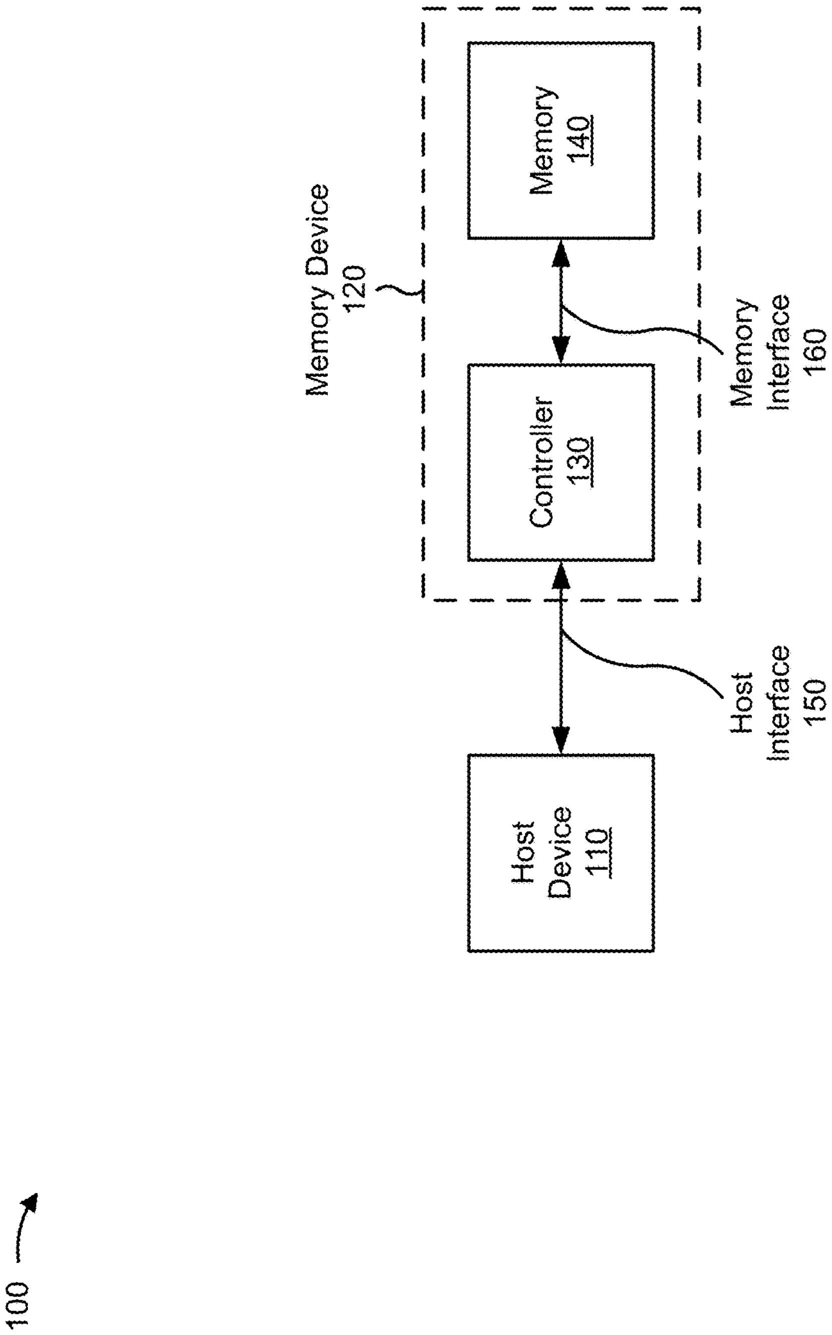
FIG. 1 is a diagram illustrating an example system capable of selection of an optimal single-level cell (SLC) programming scheme.

Data may be programmed to a memory cell using a programming scheme (sometimes referred to as a programming operation, a write scheme, and/or a write operation). In some examples, a programming scheme may be associated with one or more programming pulses (sometimes referred to as one or more programming voltages) and one or more verify operations (sometimes referred to as one or more verify pulses and/or voltages). During the one or more programming pulses, data may be written, or programmed, to one or more memory cells. For example, each programming pulse may be associated with programming a subblock of a memory die (e.g., a NAND die). During the one or more verify operations, data previously written to one or more memory cells via the one or more programming pulses may be verified to ensure that the data was properly written to the memory cell.

In some examples, a time needed for a memory device to program a subblock of a memory die, which may include a programming pulse associated with the subblock and/or a verify operation associated with the subblock, may be referred to as a programming time ($T_{prog}$) and/or an effective $T_{prog}$ (Eff_$T_{prog}$). For example, for programming schemes used to program one subblock of a memory, a time needed to complete one cycle of the programming scheme may correspond to $T_{prog}$, which is described in more detail below in connection with FIG. 3A. For programming schemes used to program multiple subblocks of memory, Eff_$T_{prog}$ may correspond to a time needed to complete one cycle of the programming scheme divided by the quantity of subblocks of memory programmed by the programming scheme, which is described in more detail below in connection with FIG. 3A. In that regard, for programming schemes used to program one subblock of a memory, $T_{prog}$ may be equal to Eff_$T_{prog}$, and thus "effective programming time" as used herein may refer to $T_{prog}$ and/or Eff_$T_{prog}$ for programming schemes used to program one subblock of memory, or Eff_$T_{prog}$ for programming schemes used to program multiple subblocks of memory.

In some examples, an effective programming time of certain programming schemes may have a direct impact on a memory system performance. For example, a memory system may use single-level cell (SLC) caching for host data that is to be later transferred to a multi-bit cell during a background operation, such as a triple-level cell (TLC) or quad-level cell (QLC). Accordingly, an effective programming time associated with an SLC programming scheme may directly impact overall system performance. For example, an SLC programming scheme associated with a relatively high effective programming time may result in high power consumption and slow operation of the memory system, resulting in degraded system performance.

In some examples, in order to reduce an effective programming time associated with an SLC programming scheme, one or more programming pulses and/or verify pulses may be combined and/or eliminated, thereby reducing power consumption and/or increasing operation speed. For example, a verify pulse may be eliminated altogether, multiple programming pulses used to program multiple subblocks may be associated with a single verify pulse, and/or a single programming pulse may be used to program multiple subblocks in an effort to reduce an effective programming time associated with a programming scheme and otherwise improve system performance. However, certain programming schemes that may reduce an effective programming time for one type of memory architecture and/or configuration may not have an intended benefit for another type of memory architecture and/or configuration. For example, for memory devices in which multiple memory dies (sometimes referred to as logical units (LUNs)) are associated with a single channel due to hardware limitations, a programming scheme may alternate between subblocks of different memory dies (e.g., LUNs), thereby reducing the effectiveness or certain programming schemes. As a result, using certain programming schemes for certain types of memory systems may cause increased power consumption, increased effective programming time, and otherwise inefficient memory system operations.

Some implementations described herein enable selection of optimal SLC programming schemes, thereby reducing power consumption and/or an effective programming time associated with SLC operations, and otherwise improving memory system performance. In some implementations, a memory device may receive a program command (sometimes referred to herein as a write command) associated with host data that is to be written to memory (e.g., SLC memory). The memory device may determine one or more attributes of the host data and/or system architecture, such as a size of the host data, a drive capacity associated with the memory device, a number of memory dies (e.g., LUNs) per channel, and/or other system attributes and/or features. Based on the one or more attributes of the host data and/or system architecture, the memory device may select an optimal programming scheme for writing the host data to the memory. For example, the memory device may select a programming scheme that may result in the least amount of resource consumption and/or greatest benefit to overall system performance. As a result, the memory system may select an optimal SLC programming scheme for a given program command, resulting in decreased power and other resource consumption, more efficient programming schemes, and overall improved memory system performance.

FIG. 1 is a diagram illustrating an example system 100 capable of selection of an optimal SLC programming scheme. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device or apparatus configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include control logic, a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, one or more systems, devices, apparatuses, components, and/or controllers of FIG. 1 may be configured to receive, from a host device, a program command instructing a memory device to write host data to a memory: determine at least one of a size of the host data, a memory architecture associated with the memory, or a memory configuration associated with the memory: select a programming scheme, from multiple candidate programming schemes, to be used to write the host data to the memory based on the at least one of the size of the host data, the memory architecture, or the memory configuration; and write the host data to the memory based on the programming scheme.

In some implementations, one or more systems, devices, apparatuses, components, and/or controllers of FIG. 1 may be configured to receive, from a host device, a program command: determine that the program command is associated with an SLC program command: determine a size of host data associated with the program command: select a programming scheme, from multiple candidate programming schemes, to be used to write the host data to a memory based on the size of the host data and based on determining that the program command is associated with the SLC program command; and write the host data to the memory using the programming scheme.

In some implementations, one or more systems, devices, apparatuses, components, and/or controllers of FIG. 1 may be configured to receive, from a host device, a program command instructing a memory device to write host data to a memory die, of one or more memory dies: determine at least one of a size of the host data, a memory die architecture associated with the memory die, or a memory die configuration associated with the memory die: select a programming scheme, from multiple candidate programming schemes, to be used to write the host data to the memory die based on the at least one of the size of the host data, the memory die architecture, or the memory die configuration; and write the host data to the memory die using the programming scheme.

As indicated above, FIG. 1 is provided as an example. Other examples may differ from what is described with regard to FIG. 1.

Figure 2:
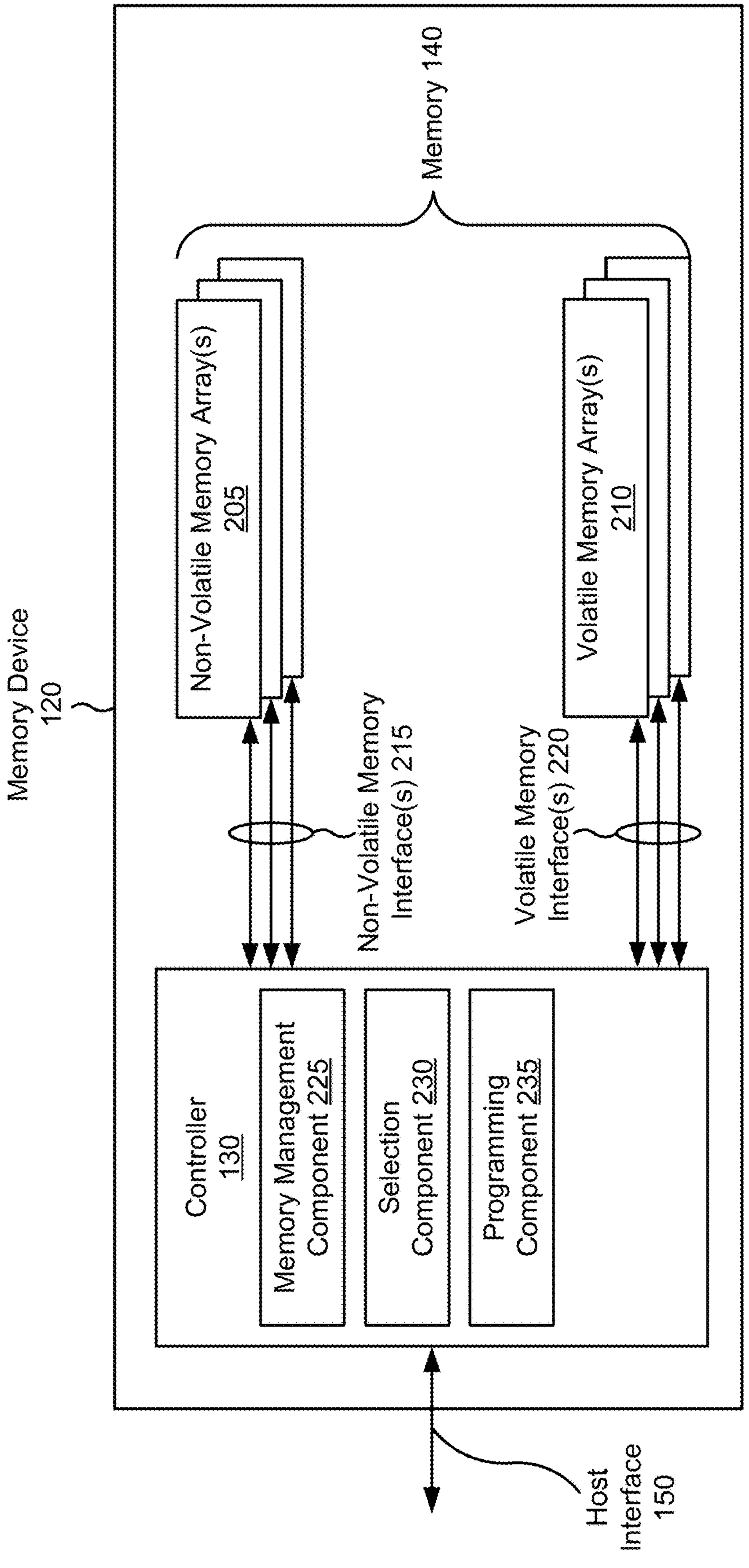
FIG. 2 is a diagram of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 205, such as one or more NAND memory array's and/or one or more NOR memory arrays. Additionally, or alternatively, the memory 140 may include one or more volatile memory arrays 210, such as one or more SRAM array's and/or one or more DRAM arrays. The controller 130 may transmit signals to and receive signals from a non-volatile memory array 205 using a non-volatile memory interface 215. The controller 130 may transmit signals to and receive signals from a volatile memory array 210 using a volatile memory interface 220.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 225, a selection component 230, and/or a programming component 235. In some implementations, one or more of these components are implemented as one or more instructions (e.g., firmware) executed by the controller 130. Alternatively, one or more of these components may be implemented as dedicated integrated circuits distinct from the controller 130.

The memory management component 225 may be configured to manage performance of the memory device 120. For example, the memory management component 225 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 225, such as information regarding memory block age, memory block erase count, and/or error information associated with a memory partition (e.g., a memory cell, a row of memory, a block of memory, or the like).

The selection component 230 may be configured to select an optimal programming scheme based on one or more attributes of host data to be programmed to the memory 140, a memory die architecture and/or configuration associated with the memory 140, and/or other attributes. In some implementations, the selection component 230 may include, or may otherwise be associated with, a lookup table or a similar data set for selecting an optimal programming scheme. The lookup table or similar data set may associate various inputs with various programming schemes. For example, the lookup table or similar data set may associate a size of host data to be programmed, a number of memory dies (e.g., LUNs) per channel associated with the memory 140, and/or similar inputs, with various candidate programming schemes to be selected by the selection component 230.

The programming component 235 may be configured to program, or write, host data to the memory 140. In some implementations, the programming component 235 may be configured to selectively implement one of multiple candidate programming schemes in order to program or write host data to the memory 140. The programming component 235 may be capable of applying a voltage to a memory cell, such as for a purpose of storing a threshold voltage corresponding to a binary value in the memory cell. For example, for SLC program commands, the programming component 235 may be capable of programming each SLC to one of a first threshold voltage representing a binary 0 or a second threshold voltage representing a binary 1.

One or more devices or components shown in FIG. 2 may be configured to perform operations described herein, such as one or more operations and/or methods described in connection with FIGS. 3A-6. For example, the controller 130, the memory management component 225, the selection component 230, and/or the programming component 235 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3A:
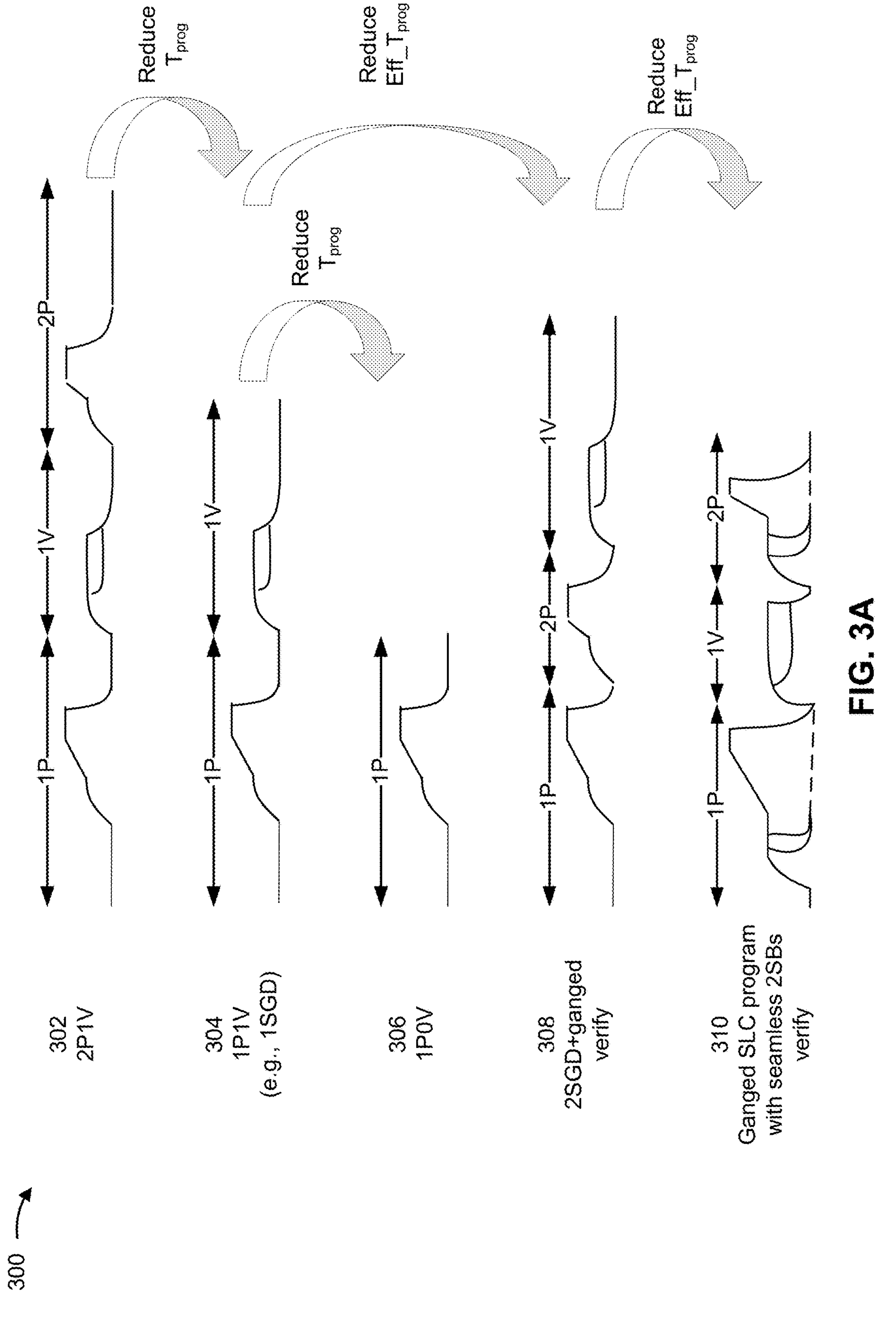
FIGS. 3A-3B are diagrams of an example associated with various SLC programming schemes.
Figure 3B:
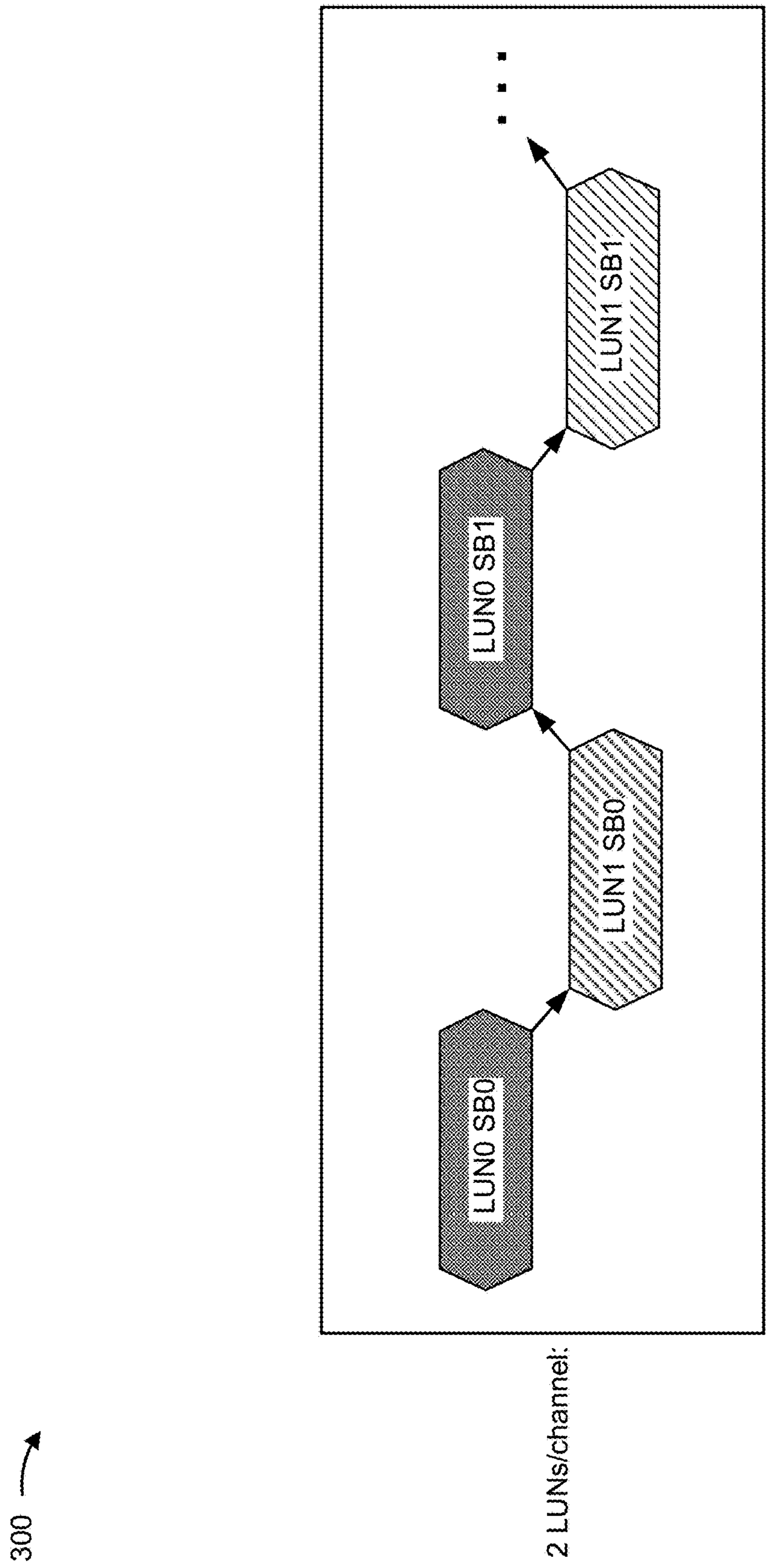

FIGS. 3A-3B are diagrams of an example 300 associated with various SLC programming schemes. The operations described in connection with FIGS. 3A-3B may be performed by the memory device 120 and/or one or more components of the memory device 120, such as the controller 130 and/or one or more components of the controller 130.

In some implementations, the memory device 120 may be configured to selectively implement one of multiple candidate programming schemes and/or operations. For example, in some implementations, the memory device 120 may be configured to use one of the programming schemes shown in FIG. 3A to program an SLC memory, such as for a purpose of caching host data in the SLC memory that may later be transferred to a TLC memory, a QLC memory, or another memory location during a background operation of the memory device 120.

As shown by reference number 302, in some implementations the memory device 120 may be configured to write host data to an SLC memory (e.g., an SLC LUN) using two program pulses and one program verify operation, which may be referred to as a two-pulse, one-verify (2P1V) programming scheme. As shown, the example 2P1V programming scheme may include a first program pulse (shown as "1P") that is followed by a program verify operation (shown as "1V") that is followed by a second program pulse (shown as "2P"). In some implementations, the 2P1V write voltage pattern may be applied to a single subblock of memory to program the memory cells included in that subblock.

In some implementations, when a memory device 120 performs a 2P1V programming scheme, the memory device 120 may raise the voltage on a selected access line from a baseline voltage to a first program voltage during a first time period that corresponds to the first program pulse (e.g., P1). The first program voltage may program a first set of memory cells (sometimes called pass memory cells) on the selected access line to a desired state and may fail to program a second set of memory cells (sometimes called fail memory cells) on the selected access line to the desired state.

After applying the first program voltage, the memory device 120 may reduce the voltage on the selected access line to the baseline voltage. The memory device 120 may then raise the voltage on the selected access line from the baseline voltage to a verify voltage during a second time period that corresponds to the program verify operation (e.g., 1V). After raising the voltage to the verify voltage, the memory device 120 may perform a sensing operation (e.g., a read operation) to detect whether the verify voltage applied to a memory cell causes that memory cell to conduct (e.g., whether current flows through the memory cell when the verify voltage is applied). Based on a desired state of the memory cell and based on whether the memory cell conducts when the verify voltage is applied, the memory device 120 may identify the memory cell as a pass memory cell that stores the desired state or a fail memory cell that does not store the desired state. For example, in an SLC that stores one of two data states, the memory device 120 may apply a verify voltage that is between a first threshold voltage corresponding to a first data state (e.g., 1) and a second threshold voltage corresponding to a second data state (e.g., 0)). In this example, the memory cell stores the first data state (e.g., 1) if current is detected, and the memory cell stores the second data state (e.g., 0) if current is not detected. After applying the verify voltage, the memory device 120 may reduce the voltage on the selected access line to the baseline voltage.

The memory device 120 may then raise the voltage on the selected access line from the baseline voltage to a second program voltage during a third time period that corresponds to the second program pulse (e.g., 2P). The second program voltage may be greater in magnitude than the first program voltage, which may cause some or all of the fail memory cells (e.g., that were not successfully programmed to the desired state based on application of the first program voltage) to be programmed to the desired state. After applying the second program voltage, the memory device 120 may reduce the voltage on the selected access line to the baseline voltage to complete the 2P1V programming.

In some implementations, memory cells that were successfully programmed by the first program voltage, as determined during the program verify operation, may be inhibited from being programmed with the second program voltage. This may increase endurance and prolong a lifespan of those memory cells, as compared to a scenario where the second program voltage is applied to those memory cells, by preventing the second program voltage from causing degradation of those memory cells. Thus, in some implementations, the 2P1V programming scheme may be considered a high endurance write operation compared to the other programming schemes described below. However, in some implementations, the 2P1V programming scheme may be considered a slow write operation as compared to the write voltage patterns described below. That is, an effective programming time (e.g., $T_{prog}$) associated with the 2P1V programming scheme (e.g., a time associated with programming a subblock of data) may be relatively high.

Accordingly, as shown by reference number 304, in some implementations the controller 130 may be configured to write host data to an SLC memory (e.g., an SLC LUN) using one program pulse and one program verify operation, and thus may be called a one-pulse, one-verify (1P1V) programming scheme (sometimes alternatively referred to as a one select gate drain (1SGD) programming scheme). In such implementations, when a memory device 120 performs a 1P1V programming scheme, the memory device 120 may raise the voltage on a selected access line from a baseline voltage to a program voltage during a first time period that corresponds to a program pulse (e.g., 1P), in a similar manner as described above in connection the 2P1V programming scheme shown in connection with reference number 302. The memory device 120 may then perform a program verify operation (e.g., 1V) by applying a verify voltage during a second time period, in a similar manner as described above in connection with the 2P1V programming scheme shown in connection with reference number 302. Unlike the 2P1V programming scheme, the memory device 120 does not apply a second program pulse after performing the program verify operation in the 1P1V write operation. In some implementations, the program verify operation may be performed to determine whether at least a threshold quantity of memory cells have been successfully programmed. A write operation may pass or fail based on whether at least the threshold quantity of memory cells has been successfully programmed.

In some implementations, the program voltage of the 1P1V write operation is greater than the first program voltage of the 2P1V write operation described above in connection with reference number 302. For example, the program voltage of the 1P1V write operation may be greater than or equal to the second program voltage of the 2P1V write operation described above in connection with reference number 302. As a result, a greater quantity of memory cells may be programmed by the single program pulse of the 1P1V programming scheme as compared to the first program pulse of the 2P1V programming scheme. Because the 1P1V programming scheme includes fewer program pulses than the 2P1V programming scheme, the 1P1V programming scheme may be associated a faster write time than the 2P1V programming scheme (e.g., an effective programming time (e.g., $T_{prog}$) may be reduced as compared to the 2P1V programming scheme).

As shown by reference number 306, in some implementations the memory device 120 may be configured to write host data to an SLC memory (e.g., an SLC LUN) using one program pulse and no verify program operations, and thus may be called a one-pulse, zero-verify (1P0V) programming scheme. In such implementations, when a memory device 120 performs a 1P0V programming scheme, the memory device 120 may raise the voltage on a selected access line from a baseline voltage to a program voltage during a first time period that corresponds to a program pulse (e.g., 1P), in a similar manner as described above in connection with reference numbers 302 and 304. Unlike the 2P1V write operation and the 1P1V write operation, however, the memory device 120 may not perform a program verify operation after applying the single program pulse in the 1P0V write operation.

In some implementations, the program voltage of the 1P0V write operation may be greater than the first program voltage of the 2P1V write operation described above in connection with reference number 302. For example, the program voltage of the 1P0V write operation may be greater than or equal to the second program voltage of the 2P1V write operation described above in connection with reference number 302. Additionally, or alternatively, the program voltage of the 1P0V write operation may be greater than or equal to the program voltage of the 1P1V write operation (because the memory device 120 does not verify that memory cells have been successfully programmed in the 1P0V write operation, and therefore may apply a greater voltage to increase the likelihood of successful programming).

As a result, a greater quantity of memory cells may be programmed by the single program pulse of the 1P0V write operation as compared to the first program pulse of the 2P1V write operation (and, in some implementations, as compared to the single program pulse of the 1P1V write operation). Because the 1P0V write operation includes fewer program pulses and fewer program verify operations than the 2P1V write operation, the 1P0V programming scheme may have a faster write time than the 2P1V programming scheme. Furthermore, because the 1P0V programming scheme includes fewer program verify operations than the 1P1V programming scheme, the 1P0V programming scheme may have a faster write time than the 1P1V programming scheme.

In some implementations, a verify operation may be associated with multiple subblocks (e.g., multiple programming pulses, each associated with a different subblock), thereby further reducing an effective programming time (e.g., $Eff\_T_{prog}$) associated with each subblock. Such programming schemes may be referred to as "ganged" programming schemes and/or a verify operation associated with such a programming scheme may be referred to as a "ganged verify." operation. For example, reference number 308 shows one example of a ganged verify operation, sometimes referred to as a two select gate drain (2SGD) plus ganged verify programming scheme. In 2SGD plus ganged verify programming schemes, the memory device 120 may be configured to write host data to a first subblock of an SLC memory (e.g., a first subblock of an SLC LUN) using one program pulse (e.g., 1P) and to write host data to a second subblock of SLC memory (e.g., a second subblock of an SLC LUN) using another program pulse (e.g., 2P), with one program verify operation (e.g., 1V) ganged to the first program pulse and the second program pulse.

Put another way, for the 2SGD plus ganged verify programming scheme, the memory device 120 may apply a program pulse to each of two different subblocks of memory, and may then perform a group verify operation for both subblocks. For example, the memory device 120 may apply two program pulses (e.g., 1P and 2P), each associated with a different subblock of the memory device 120, followed by a program verify operation (e.g., a group program verify operation). A "subblock" is a portion of a memory block. For example, a subblock may include a subset of NAND strings and/or memory cells included in a block, and each subblock may be mutually exclusive from one another. A bit line may be shared by multiple subblocks. For example, a first subblock (e.g., Subblock 0) may include a first group of NAND strings, a second subblock (e.g., Subblock 1) may include a second group of NAND strings, a third subblock (e.g., Subblock 2) may include a third group of NAND strings, and a fourth subblock (e.g., Subblock 3) may include a fourth group of NAND strings. Each NAND string may include a respective memory cell that is on the selected access line to be programmed.

As shown, the memory device 120 may apply a first program pulse (e.g., 1P) to the first sub-block by applying a program voltage on the selected access line for the first subblock (e.g., while the first subblock is selected and the other subblocks are not selected) during a first time period, in a similar manner as described elsewhere herein. After applying the first program pulse, the memory device 120 may apply a second program pulse (e.g., 2P) to the second subblock by applying the program voltage on the selected access line for the second subblock (e.g., while the second subblock is selected and the other subblocks are not selected) during a second time period, in a similar manner as described elsewhere herein.

After applying a separate program pulse to each subblock, the memory device 120 may perform a group program verify operation (e.g., 1V) on all of the subblocks (e.g., simultaneously, concurrently, or in parallel). The group program verify operation may include applying a verify voltage during a third time period. The memory device 120 may apply the verify voltage to all of the subblocks, such as by selecting all of the subblocks while applying the verify voltage to the access line. After raising the voltage to the verify voltage, the memory device 120 may perform a sensing operation (e.g., a read operation) to detect memory cells that are programmed to the desired state and to detect memory cells that are not programmed to the desired state.

Because the 2SGD plus ganged verify programming scheme includes fewer total verify operations than the 2P1V programming scheme and/or the 1P1V programming scheme, the 2SGD plus ganged verify programming scheme may have a faster write time per subblock than the 2P1V programming scheme and/or the 1P1V programming scheme (e.g., an effective programming time ($Eff\_T_{prog}$) associated with the 2SGD plus ganged verify programming scheme, which may be an average programming time per subblock programmed, may be less than the effective programming time ($T_{prog}$) of the 2P1V programming scheme and/or the 1P1V programming scheme).

Reference number 310 shows another example of a ganged verify operation, sometimes referred to as a ganged SLC program with ganged verify and/or seamless two subblocks verify programming scheme. In ganged SLC program, the memory device 120 may be capable of programming two or more sub-blocks with a single program pulse. In the example shown by reference number 310, the memory device 120 may apply a first program pulse (e.g., 1P) configured to write to two subblocks of the memory device 120 (e.g., Subblock 0 and Subblock 1), followed by a group program verify operation (e.g., 1V) on the two subblocks, followed by a second program pulse (e.g., 2P) configured to write to the two subblocks of the memory device. In some implementations, such as implementations utilizing a seamless two subblocks verify operation, the memory device 120 may sense a voltage written to each subblock twice, with each select gate drain (SGD) and bitline signal being toggled separately. In some other implementations, a ganged SLC program may alternatively be combined with a ganged verify operation, such as the ganged verify operation described above in connection with reference number 308.

For example, the memory device 120 may apply the first program pulse (e.g., 1P) to the first subblock and the second subblock by applying a first program voltage on the selected access line for the first subblock and the second subblock during a first time period. After applying the first program pulse, the memory device 120 may perform a group program verify operation (e.g., 1V) on the first subblock and the second subblock (e.g., simultaneously, concurrently, or in parallel). The group program verify operation may include applying a verify voltage during a second time period, in a similar manner as described above in connection with the 2SGD plus ganged verify programming scheme. The memory device 120 may identify pass memory cells and fail memory cells in the first subblock and the second subblock, and may apply the second program pulse (e.g., 2P) to the first subblock and the second subblock by applying a second program voltage on the selected access line for fail memory cells of the first subblock and the second subblock during a third time period. Because the ganged SLC program with seamless two subblocks verify programming scheme is capable of writing to multiple subblocks using the same program pulse, the ganged SLC program with seamless two subblocks verify programming scheme may have a faster write time on a per-subblock basis than the 1P1V programming scheme and/or the 2SGD plus ganged verify programming scheme.

In that regard, and all else being equal, using certain programming schemes may result in faster effective programming times (e.g., better memory system performance) and reduced energy per bit consumption when programming SLCs. However, due to certain memory device architectures and/or configurations, among other variations, selecting a programming scheme with a smaller effective programming time may not always result in improved system performance. For example, FIG. 3B shows an example memory device associated with two LUNs (e.g., NAND dies), indexed as LUN0 and LUN1, that are associated with a single channel due to hardware constraints or otherwise. In such examples, certain programming schemes that normally may result in improved system performance as compared to a baseline or default programming scheme may instead result in degraded system performance as compared the baseline or default programming scheme.

More particularly, due to hardware limitations or otherwise, certain memory devices 120 may include multiple dies (e.g., LUNs) that share a same channel. In such examples, a programming sequence may alternate between the various LUNs, filling up each subblock consecutively. For example, when programming the two LUNs shown in FIG. 3B (e.g., LUN0 and LUN1), a programming sequence may program a first subblock (shown as SB0) associated with a first LUN (e.g., LUN0) first, then may program a first subblock (e.g., SB0) associated with a second LUN (e.g., LUN1) second, then may program a second subblock (shown as SB1) associated with the first LUN (e.g., LUN0) third, and so forth, alternating between the subblocks of the various LUNs sharing the channel.

Programming the multiple LUNs in this manner may reduce or eliminate the system performance benefits associated with certain programming schemes. For example, a system performance benefit typically achieved by utilizing a 2SGD plus ganged verify programming scheme as compared to a 1SGD programming scheme (e.g., a 1P1V programming scheme) may be reduced or eliminated for memory systems associated with multiple LUNs per channel. Moreover, in some examples, a size of data to be written during a programming scheme may be proportional to system performance benefits associated with certain programming schemes. For example, for certain programming schemes, the smaller the data size (sometimes referred to a chunk size) the less the system performance benefit achieved by the programming scheme. Furthermore, in some examples, a drive capacity associated with a memory device may be inversely proportional to system performance benefits associated with certain programming schemes. For example, for certain programming schemes, the larger the drive capacity associated with the memory device 120, the less the system performance benefit achieved by the programming scheme. For example, a 2SGD plus ganged verify programming scheme may achieve a greater system performance benefit for 128 gigabyte (GB) drives than for 256 GB drives.

According to some implementations described herein, a memory device 120 may select an optimal programming scheme to be used to perform an SLC program operation based on a data size of host data to be written to an SLC memory, a capacity of a memory device associated with the SLC memory, a number of dies (e.g., LUNs) associated with each channel in the SLC memory, and/or other factors. In this regard, the memory device 120 may optimize a system performance improvement associated with SLC write commands, thereby reducing power and other resource consumption and improving memory device operation. Example implementations associated with selecting an optimal programming scheme are described in more detail below in connection with FIGS. 4 and 5.

As indicated above, FIGS. 3A-3B are provided as an example. Other examples may differ from what is described with regard to FIGS. 3A-3B.

Figure 4:
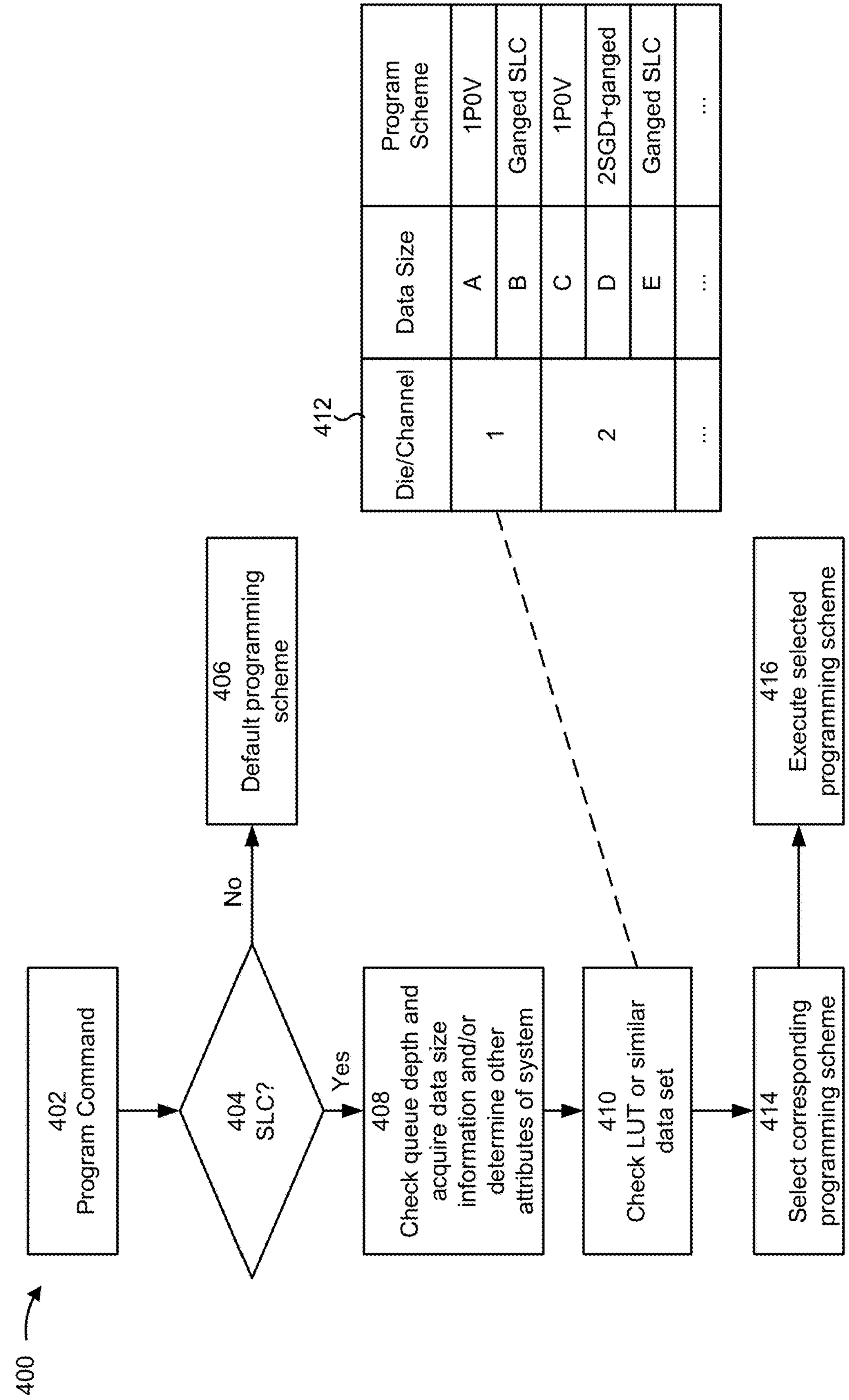
FIG. 4 is a diagram of an example of selection of an optimal SLC programming scheme.

FIG. 4 is a diagram of an example 400 of selection of an optimal SLC programming scheme. The operations described in connection with FIG. 4 may be performed by the memory device 120 and/or one or more components of the memory device 120, such as the controller 130 and/or one or more components of the controller 130.

As shown by reference number 402, the memory device 120 may receive, from a host device 110, a program command (e.g., a write command) instructing the memory device 120 to write host data to a memory (e.g., memory 140, such as a memory die, a NAND die, or the like). As shown by reference number 404, the memory device 120 determine whether the program command is associated with an SLC program command (e.g., whether the program command is associated with writing host data to SLC memory). For example, the memory device 120 may determine whether the program command is associated with caching the host data to SLC memory, which may later be transferred to TLC memory, QLC memory, or the like during a background operation of the memory device 120. If the program is not associated with an SLC program command (shown as "no" in the operations indicated by reference number 404), such as a program command that is associated with directly writing the host data to multi-level cell (MLC) memory, TLC memory, QLC memory, or the like, then the memory device 120 may use a baseline and/or a default programming scheme to write the host data to memory, as indicated by reference number 406. For example, the memory device 120 may write the host data to the MLC memory, the TLC memory, the QLC memory, or the like using a pre-selected and/or pre-configured programming scheme. Put another way, based on determining that a program command is not associated with an SLC program command, the memory device 120 may write the host data to a memory using a default programming scheme.

However, if the program command is associated an SLC program command (shown as "yes" in the operations indicated by reference number 404), the memory device 120 may proceed through the remaining steps and/or operations shown in FIG. 4 in order to select an optimal SLC programming scheme (e.g., one of the programming schemes described above in connection with FIG. 3A) for writing the host data to the SLC memory. More particularly, as shown by reference number 408, the memory device 120 may determine certain attributes about the host data to be written, the architecture or configuration of the memory to which the host data is to be written, or the like. For example, the memory device 120 may determine at least one of a size of the host data, a memory architecture associated with the memory to which the host data is to be written, or a memory configuration associated with the memory to which the host data is to be written.

In some examples, to determine the size of the host data, the memory device 120 may check a queue depth associated with the program command, thereby acquiring data size information associated with the program command. In some other examples, to determine a memory architecture associated with the memory and/or a memory configuration associated with the memory, the memory device 120 may determine a drive capacity associated with the memory device 120 (e.g., 128 GB, 256 GB, or the like), the memory device 120 may determine a number of dies (e.g., LUNs) per channel associated with the memory to which the host data is to be written, or the memory device 120 may determine similar information.

As shown by reference number 410, the memory device 120 may reference a lookup table 412 (abbreviated as "LUT" in FIG. 4) or a similar data set in order to determine an optimal programming scheme to be used for writing the host data to the memory. For example, the example lookup table 412 shown in FIG. 4 may associate a number of dies (e.g., LUNs) per channel and/or a size of host data to be written, with a corresponding optimal programming scheme. For example, if the memory is associated with one die and/or LUN per channel and a first data size (shown in FIG. 4 as data size "A"), then the lookup table 412 may indicate that a 1P0V programming scheme (e.g., the programming scheme described above in connection with reference number 306) is an optimal programming scheme for writing the host data to the memory. On the other hand, if the memory is associated with one die and/or LUN per channel and a second data size (shown in FIG. 4 as data size "B"), then the lookup table 412 may indicate that a ganged SLC program with seamless two subblocks verify programming scheme (e.g., the programming scheme described above in connection with reference number 310) is an optimal programming scheme for writing the host data to the memory. Similarly, if the memory is associated with two dies and/or LUNs per channel and a third data size (shown in FIG. 4 as data size "C"), then the lookup table 412 may indicate that a 1P0V programming scheme is an optimal programming scheme for writing the host data to the memory. If the memory is associated with two dies and/or LUNs per channel and a fourth data size (shown in FIG. 4 as data size "D"), then the lookup table 412 may indicate that a 2SGD plus ganged verify programming scheme (e.g., the programming scheme described above in connection with reference number 308) is an optimal programming scheme for writing the host data to the memory. If the memory is associated with two dies and/or LUNs per channel and a fifth data size (shown in FIG. 4 as data size "E"), then the lookup table 412 may indicate that a ganged SLC program with seamless two subblocks verify programming scheme is an optimal programming scheme for writing the host data to the memory. The lookup table 412 may indicate additional programming schemes to be used for different memory configurations and/or data sizes.

The lookup table 412 shown in FIG. 4 is provided as an example, and in other implementations a lookup table and/or data set associated with the memory device 120 and/or used by the memory device 120 for selecting an optimal programming scheme may differ from what is shown in FIG. 4. For example, a lookup table or other data set used by the memory device 120 to select an optimal programming scheme may have a finer granularity and/or different and/or additional programming schemes than what is depicted in FIG. 4. Moreover, in some implementations, the data sizes shown in FIG. 4 (e.g., data sizes A, B, C, D, and E) may be data size thresholds and/or inclusive ranges of data sizes. In implementations in which the data sizes are data size thresholds, the memory device may select an optimal programming scheme associated with a data size threshold that is satisfied by the size of the host data (e.g., the chunk size).

For example, in some implementations, a threshold associated with data size A may be smaller than a threshold associated with data size B. In that regard, if the memory is associated with one die and/or LUN per channel and the size of the host data to be written to memory (as determined according to a queue depth associated with the program command, or the like) satisfies the threshold associated with data size A but does not satisfy the threshold associated with data size B, then the lookup table 412 may indicate that the 1P0V programming scheme is an optimal programming scheme. On the other hand, if the memory is associated with one die and/or LUN per channel and the size of the host data to be written to memory satisfies the threshold associated with data size B, then the lookup table 412 may indicate that the ganged SLC program with seamless two subblocks verify programming scheme is an optimal programming scheme.

Moreover, in some implementations, the data size C may be smaller than data size D, and the data size D may be smaller than data size E. In that regard, if the memory is associated with two dies and/or LUNs per channel and the size of the host data to be written to memory (as determined according to a queue depth associated with the program command, or the like) satisfies the threshold associated with data size C but does not satisfy the threshold associated with data size D, then the lookup table 412 may indicate that the 1P0V programming scheme is an optimal programming scheme. If the memory is associated with two dies and/or LUNs per channel and the size of the host data to be written to memory satisfies the threshold associated with data size D but does not satisfy the threshold associated with data size E, then the lookup table 412 may indicate that the 2SGD plus ganged verify programming scheme is an optimal programming scheme. If the memory is associated with two dies and/or LUNs per channel and the size of the host data to be written to memory satisfies the threshold associated with data size E, then the lookup table 412 may indicate that the ganged SLC program with seamless two subblocks verify programming scheme is an optimal programming scheme.

As shown by reference number 414, based on the size of the host data to be written, a memory architecture associated with the memory and/or a memory configuration associated with the memory (e.g., a drive capacity, a number of LUNs per channel, or the like), or similar information, the memory device may select a programming scheme to be used to write the host data to the memory. For example, the memory device may select the optimal programming scheme using a lookup table (e.g., lookup table 412) or a similar data set. In some implementations, selecting the programming scheme may include selecting one of the programming schemes described above in connection with FIG. 3A. For example, the memory device 120, using a lookup table or similar data set, may select one of a first programming scheme associated with two programming pulses and one verify operation (e.g., the 2P1V programming scheme described above in connection with reference number 302), a second programming scheme associated with one programming pulse and one verify operation (e.g., the 1P1V programming scheme described above in connection with reference number 304), a third programming scheme associated with one programming pulse and no verify operations (e.g., the 1P0V programming scheme described above in connection with reference number 306), a fourth programming scheme associated with two SGD programming pulses and one verify operation (e.g., the 2SGD plus ganged verify programming scheme described above in connection with reference number 308), or a fifth programming scheme associated with two ganged SLC programming pulses and a seamless two subblock verify operation (e.g., the ganged SLC program with seamless two subblocks verify programming scheme described above in connection with reference number 310).

Put another way, in the operations shown in connection with reference number 414, the memory device 120 may select a programming scheme, from multiple candidate programming schemes, to be used to write the host data to the memory based on the at least one of the size of the host data, the memory architecture, the memory configuration, or similar information. In some implementations, the memory device 120 may select a programming scheme (via use of a lookup table or similar data set) that results in a greatest system performance, such as by selecting a programming scheme associated with a lowest effective programming time. Put another way, in some implementations, to select the programming scheme, the memory device 120 may select a programming scheme, of the multiple candidate programming schemes, that is associated with a smallest effective programming time based on the at least one of the size of the host data, the memory die architecture, the memory die configuration, or similar information.

As shown by reference number 416, the memory device may write the host data to memory using the selected programming scheme (e.g., the optimal programming scheme indicated by the lookup table 412, or otherwise). In this way, the memory device 120 may write data to SLC memory (e.g., for a purpose of caching host data in SLC memory prior to transferring the data to TLC memory, QLC memory, or the like during a background operation) using a programming scheme that optimizes system performance. As a result, the memory system may select an optimal SLC programming scheme for a given program command, resulting in decreased power and other resource consumption, more efficient programming schemes, and overall improved memory system performance.

As indicated above, FIG. 4 is provided as an example. Other examples may differ from what is described with regard to FIG. 4.

Figure 5:
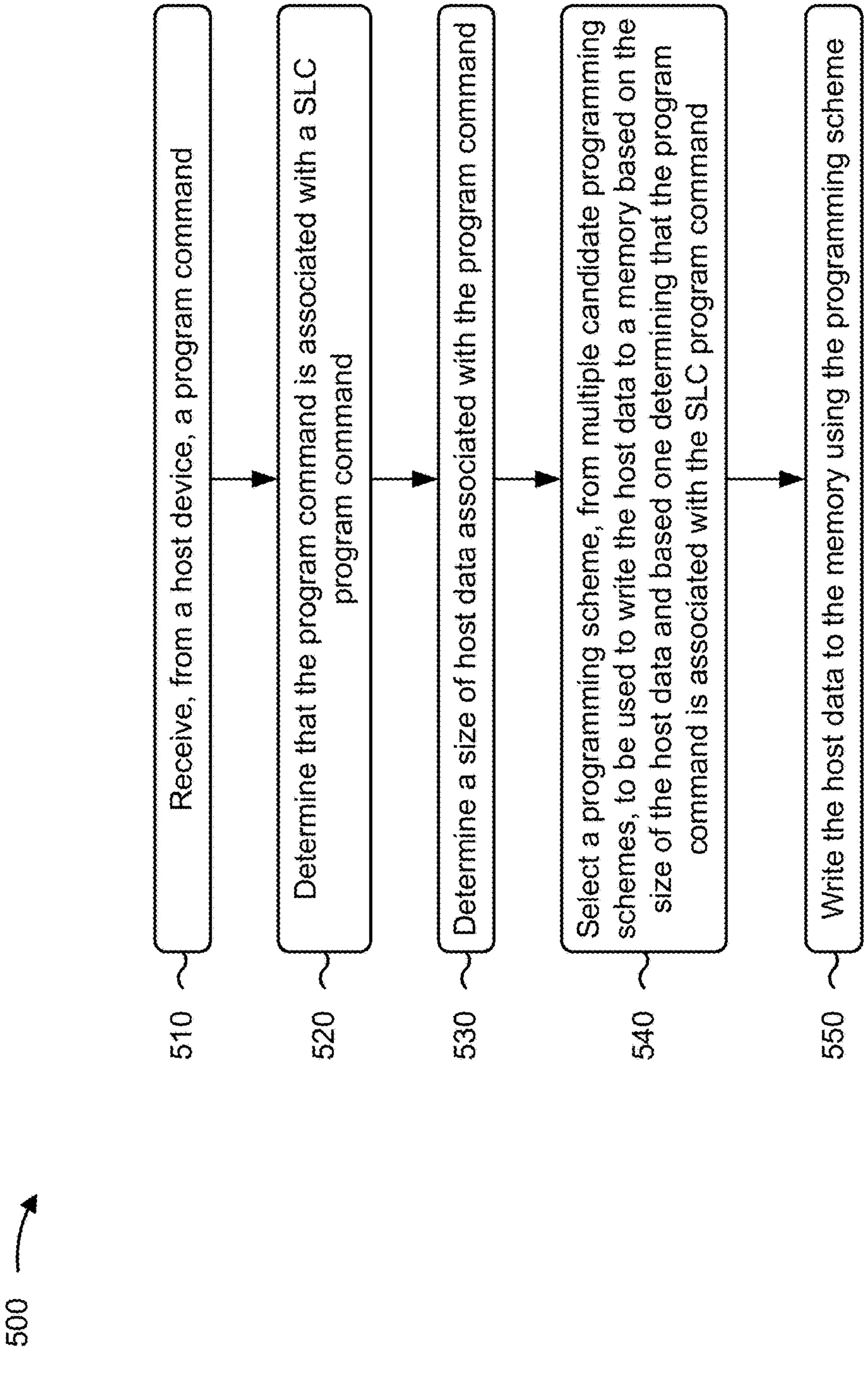
FIG. 5 is a flowchart of an example method associated with selection of an optimal SLC programming scheme.

FIG. 5 is a flowchart of an example method 500 associated with selection of an optimal SLC programming scheme. In some implementations, a memory device (e.g., the memory device 120) may perform or may be configured to perform the method 500. In some implementations, another device or a group of devices separate from or including the memory device (e.g., the system 100) may perform or may be configured to perform the method 500. Additionally, or alternatively, one or more components of the memory device (e.g., the controller 130, the memory management component 225, the selection component 230, and/or the programming component 235) may perform or may be configured to perform the method 500. Thus, means for performing the method 500 may include the memory device and/or one or more components of the memory device 120. Additionally, or alternatively, a non-transitory computer-readable medium may store one or more instructions that, when executed by the memory device (e.g., the controller 130 of the memory device 120), cause the memory device to perform the method 500.

As shown in FIG. 5, the method 500 may include receiving, from a host device, a program command (block 510). As further shown in FIG. 5, the method 500 may include determining that the program command is associated with an SLC program command (block 520). As further shown in FIG. 5, the method 500 may include determining a size of host data associated with the program command (block 530). As further shown in FIG. 5, the method 500 may include selecting a programming scheme, from multiple candidate programming schemes, to be used to write the host data to a memory based on the size of the host data and based on determining that the program command is associated with the SLC program command (block 540). As further shown in FIG. 5, the method 500 may include writing the host data to the memory using the programming scheme (block 550).

The method 500 may include additional aspects, such as any single aspect or any combination of aspects described below and/or described in connection with one or more other methods or operations described elsewhere herein.

In a first aspect, the method 500 includes determining at least one of a memory architecture associated with the memory or a memory configuration associated with the memory, wherein selecting the programming scheme is further based on the at least one of the memory architecture or the memory configuration.

In a second aspect, alone or in combination with the first aspect, determining the at least one of the memory architecture or the memory configuration includes determining a number of dies per channel associated with the memory.

In a third aspect, alone or in combination with one or more of the first and second aspects, the multiple candidate programming schemes include at least one of a first programming scheme associated with two programming pulses and one verify operation, a second programming scheme associated with one programming pulse and one verify operation, a third programming scheme associated with one programming pulse and no verify operations, a fourth programming scheme associated with two select gate drain programming pulses and one verify operation, or a fifth programming scheme associated with two ganged single level cell programming pulses and a seamless two subblock verify operation.

In a fourth aspect, alone or in combination with one or more of the first through third aspects, selecting the programming scheme includes selecting a programming scheme, of the multiple candidate programming schemes, that is associated with a smallest effective programming time based on the size of the host data.

In a fifth aspect, alone or in combination with one or more of the first through fourth aspects, selecting the programming scheme includes referencing a lookup table.

Although FIG. 5 shows example blocks of a method 500, in some implementations, the method 500 may include additional blocks, fewer blocks, different blocks, or differently arranged blocks than those depicted in FIG. 5. Additionally, or alternatively, two or more of the blocks of the method 500 may be performed in parallel. The method 500 is an example of one method that may be performed by one or more devices described herein. These one or more devices may perform or may be configured to perform one or more other methods based on operations described herein.

Figure 6:
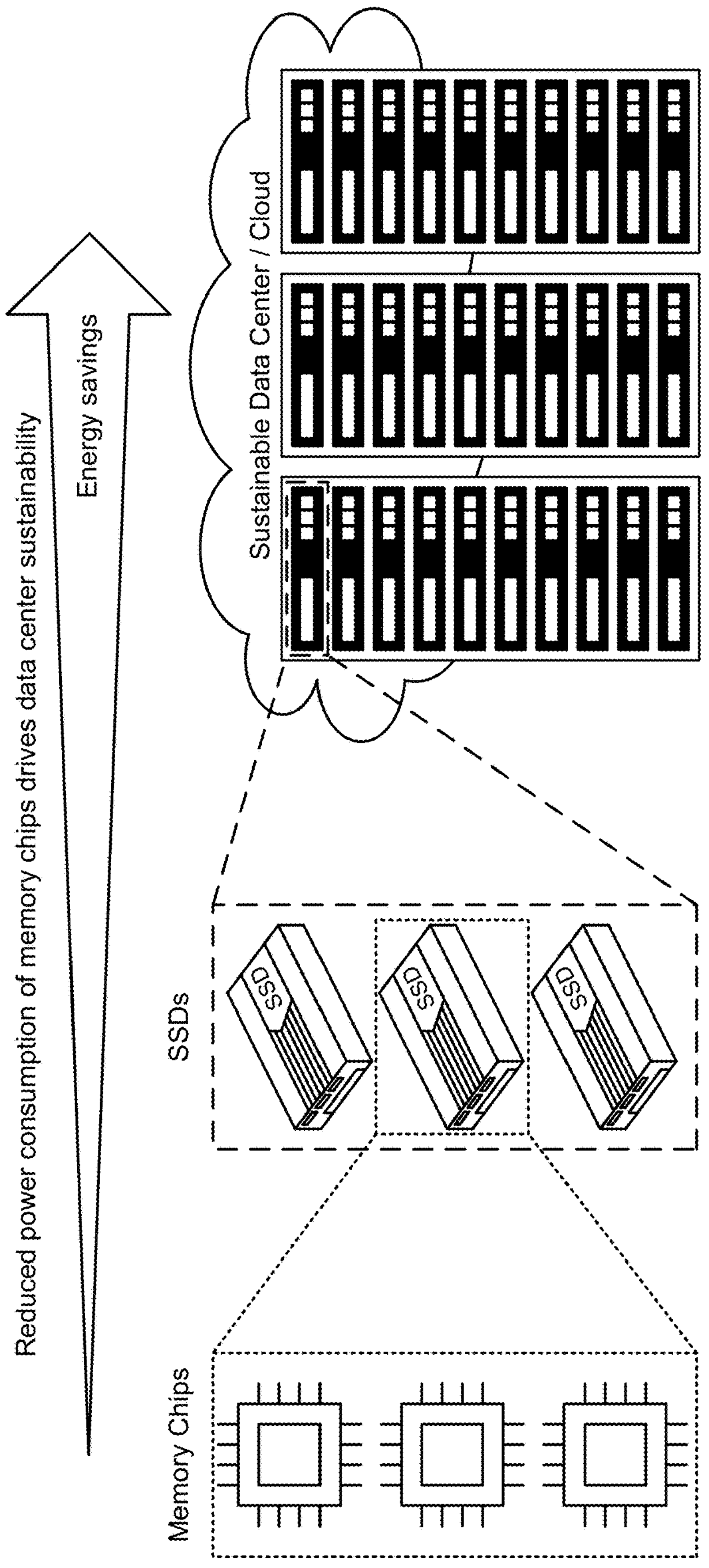
FIG. 6 is a diagram illustrating example systems in which the memory device described herein may be used.

FIG. 6 is a diagram illustrating example systems in which the memory device 120 described herein may be used. In some implementations, one or more memory devices 120 may be included in a memory chip. Multiple memory chips may be packaged together and included in a higher level system, such as an SSD or another type of memory drive. Each SSD may include, for example, up to five memory chips, up to ten memory chips, or more. A data center or cloud computing environment may include multiple SSDs to store a large amount of data. For example, a data center may include hundreds, thousands, or more SSDs.

As described above, some implementations described herein reduce power consumption of a memory device 120. As shown in FIG. 6, this reduced power consumption drives data center sustainability and leads to energy savings because of the large volume of memory devices 120 included in a data center.

As indicated above, FIG. 6 is provided as an example. Other examples may differ from what is described with regard to FIG. 6.

In some implementations, a memory device includes one or more components configured to: receive, from a host device, a program command instructing the memory device to write host data to a memory: determine at least one of a size of the host data, a memory architecture associated with the memory, or a memory configuration associated with the memory: select a programming scheme, from multiple candidate programming schemes, to be used to write the host data to the memory based on the at least one of the size of the host data, the memory architecture, or the memory configuration; and write the host data to the memory based on the programming scheme.

In some implementations, a method includes receiving, from a host device, a program command: determining that the program command is associated with an SLC program command: determining a size of host data associated with the program command: selecting a programming scheme, from multiple candidate programming schemes, to be used to write the host data to a memory based on the size of the host data and based on determining that the program command is associated with the SLC program command; and write the host data to the memory using the programming scheme.

In some implementations, a memory device includes one or more memory dies; and a controller, the controller being configured to: receive, from a host device, a program command instructing the memory device to write host data to a memory die, of the one or more memory dies: determine at least one of a size of the host data, a memory die architecture associated with the memory die, or a memory die configuration associated with the memory die: select a programming scheme, from multiple candidate programming schemes, to be used to write the host data to the memory die based on the at least one of the size of the host data, the memory die architecture, or the memory die configuration; and write the host data to the memory die using the programming scheme.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the term "approximately" means "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

When "a component" or "one or more components" (or another element, such as "a controller" or "one or more controllers") is described or claimed (within a single claim or across multiple claims) as performing multiple operations or being configured to perform multiple operations, this language is intended to broadly cover a variety of architectures and environments. For example, unless explicitly claimed otherwise (e.g., via the use of "first component" and "second component" or other language that differentiates components in the claims), this language is intended to cover a single component performing or being configured to perform all of the operations, a group of components collectively performing or being configured to perform all of the operations, a first component performing or being configured to perform a first operation and a second component performing or being configured to perform a second operation, or any combination of components performing or being configured to perform the operations. For example, when a claim has the form "one or more components configured to: perform X: perform Y; and perform Z," that claim should be interpreted to mean "one or more components configured to perform X: one or more (possibly different) components configured to perform Y; and one or more (also possibly different) components configured to perform Z."

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:

one or more components configured to:

receive, from a host device, a program command instructing the memory device to write host data to a memory;

determine at least one of a size of the host data, a memory architecture associated with the memory, or a memory configuration associated with the memory;

select a programming scheme, from multiple candidate programming schemes, to be used to write the host data to the memory based on the at least one of the size of the host data, the memory architecture, or the memory configuration; and write the host data to the memory based on the programming scheme.

2. The memory device of claim 1, wherein the one or more components are further configured to determine whether the program command is associated with a single level cell (SLC) program command, and wherein selecting the programming scheme is further based on determining that the program command is associated with the SLC program command.

3. The memory device of claim 1, wherein the one or more components are further configured to:

receive, from the host device, another program command instructing the memory device to write other host data to the memory;

determine whether the another program command is associated with a single level cell (SLC) program command; and write the other host data to the memory using a default programming scheme based on determining that the another program command is not associated with the SLC program command.

4. The memory device of claim 1, wherein the multiple candidate programming schemes include at least one of:

a first programming scheme associated with two programming pulses and one verify operation, a second programming scheme associated with one programming pulse and one verify operation, a third programming scheme associated with one programming pulse and no verify operations, a fourth programming scheme associated with two select gate drain programming pulses and one verify operation, or a fifth programming scheme associated with two ganged single level cell programming pulses and a seamless two subblock verify operation.

5. The memory device of claim 1, wherein, to determine the at least one of the size of the host data, the memory architecture, or the memory configuration, the one or more components are further configured to determine a number of dies per channel associated with the memory.

6. The memory device of claim 1, wherein, to select the programming scheme, the one or more components are further configured to select a programming scheme, of the multiple candidate programming schemes, that is associated with a smallest effective programming time based on the at least one of the size of the host data, the memory architecture, or the memory configuration.

7. The memory device of claim 1, wherein to select the programming scheme, the one or more components are further configured to reference a lookup table associated with the memory device.

8. A method, comprising:

receiving, from a host device, a program command;

determining that the program command is associated with a single level cell (SLC) program command;

determining a size of host data associated with the program command;

selecting a programming scheme, from multiple candidate programming schemes, to be used to write the host data to a memory based on the size of the host data and based on determining that the program command is associated with the SLC program command; and writing the host data to the memory using the programming scheme.

9. The method of claim 8, further comprising determining at least one of a memory architecture associated with the memory or a memory configuration associated with the memory, wherein selecting the programming scheme is further based on the at least one of the memory architecture or the memory configuration.

10. The method of claim 9, wherein determining the at least one of the memory architecture or the memory configuration includes determining a number of dies per channel associated with the memory.

11. The method of claim 8, wherein the multiple candidate programming schemes include at least one of:

a first programming scheme associated with two programming pulses and one verify operation, a second programming scheme associated with one programming pulse and one verify operation, a third programming scheme associated with one programming pulse and no verify operations, a fourth programming scheme associated with two select gate drain programming pulses and one verify operation, or a fifth programming scheme associated with two ganged single level cell programming pulses and a seamless two subblock verify operation.

12. The method of claim 8, wherein selecting the programming scheme includes selecting a programming scheme, of the multiple candidate programming schemes, that is associated with a smallest effective programming time based on the size of the host data.

13. The method of claim 8, wherein selecting the programming scheme includes referencing a lookup table.

14. A memory device, comprising:

one or more memory dies; and a controller, the controller being configured to:

receive, from a host device, a program command instructing the memory device to write host data to a memory die, of the one or more memory dies;

determine at least one of a size of the host data, a memory die architecture associated with the memory die, or a memory die configuration associated with the memory die;

select a programming scheme, from multiple candidate programming schemes, to be used to write the host data to the memory die based on the at least one of the size of the host data, the memory die architecture, or the memory die configuration; and write the host data to the memory die using the programming scheme.

15. The memory device of claim 14, wherein the controller is further configured to:

determine whether the program command is associated with a single level cell (SLC) program command; and select the programming scheme based on determining that the program command is associated with the SLC program command.

16. The memory device of claim 14, wherein the controller is further configured to:

receive, from the host device, another program command instructing the memory device to write other host data to another memory die, of the one or more memory dies;

determine whether the another program command is associated with a single level cell (SLC) program command; and write the other host data to the other memory die using a default programming scheme based on determining that the another program command is not associated with the SLC program command.

17. The memory device of claim 14, wherein the multiple candidate programming schemes include at least one of:

a first programming scheme associated with two programming pulses and one verify operation, a second programming scheme associated with one programming pulse and one verify operation, a third programming scheme associated with one programming pulse and no verify operations, a fourth programming scheme associated with two select gate drain programming pulses and one verify operation, or a fifth programming scheme associated with two ganged single level cell programming pulses and a seamless two subblock verify operation.

18. The memory device of claim 14, wherein, to determine the at least one of the size of the host data, the memory die architecture, or the memory die configuration, the controller is further configured to determine a number of dies per channel associated with the memory die.

19. The memory device of claim 14, wherein, to select the programming scheme, the controller is further configured to select a programming scheme, of the multiple candidate programming schemes, that is associated with a smallest effective programming time based on the at least one of the size of the host data, the memory die architecture, or the memory die configuration.

20. The memory device of claim 14, wherein to select the programming scheme, the controller is further configured to reference a lookup table associated with the memory device.

* * * * *